United States Patent
Shi

(10) Patent No.: US 10,665,644 B2
(45) Date of Patent: May 26, 2020

(54) ORGANIC LIGHT EMITTING DISPLAY PANEL AND FABRICATING METHOD THEREOF, DISPLAY DEVICE

(71) Applicant: Boe Technology Group Co., Ltd., Beijing (CN)

(72) Inventor: Ling Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 235 days.

(21) Appl. No.: 15/505,641

(22) PCT Filed: May 13, 2016

(86) PCT No.: PCT/CN2016/081995
§ 371 (c)(1),
(2) Date: Feb. 22, 2017

(87) PCT Pub. No.: WO2017/156857
PCT Pub. Date: Sep. 21, 2017

(65) Prior Publication Data
US 2018/0158876 A1   Jun. 7, 2018

(30) Foreign Application Priority Data
Mar. 16, 2016 (CN) .......................... 2016 1 0151108

(51) Int. Cl.
*G06F 3/041* (2006.01)
*H01L 27/32* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS

| 2007/0132368 A1 | 6/2007 | Kuwahara et al. |
| 2015/0220173 A1 | 8/2015 | Lu et al. |

(Continued)

FOREIGN PATENT DOCUMENTS

| CN | 101887904 | 11/2010 |
| CN | 103353818 A | 10/2013 |

(Continued)

OTHER PUBLICATIONS

Machine translation of KR1020140062341 into English, Shin et al. (Year: 2014).*

(Continued)

*Primary Examiner* — Brian M Butcher
(74) *Attorney, Agent, or Firm* — Calfee, Halter & Griswold LLP

(57) ABSTRACT

An organic light emitting display panel, a fabricating method thereof, and a display device are disclosed. The organic light emitting display panel comprises a base substrate, a TFT array which is arranged on the base substrate, and a touch structure which is arranged between the base substrate and the TFT array. Since the touch structure is arranged between the base substrate and the TFT array, the organic light emitting display panel has a decreased thickness.

15 Claims, 3 Drawing Sheets

(51) Int. Cl.
*G06F 3/044* (2006.01)
*H01L 51/56* (2006.01)
*H01L 51/52* (2006.01)

(52) U.S. Cl.
CPC ...... *H01L 27/3276* (2013.01); *H01L 51/5203* (2013.01); *H01L 51/56* (2013.01); *G06F 2203/04103* (2013.01); *G06F 2203/04111* (2013.01)

(56) References Cited

U.S. PATENT DOCUMENTS

| | | |
|---|---|---|
| 2016/0026287 A1 | 1/2016 | Xu et al. |
| 2016/0034066 A1* | 2/2016 | Nah .................. G06F 3/044 345/174 |
| 2016/0103537 A1* | 4/2016 | Park .................. G06F 3/0412 345/174 |
| 2016/0343787 A1* | 11/2016 | Wu .................. G02F 1/1368 |

FOREIGN PATENT DOCUMENTS

| | | |
|---|---|---|
| CN | 103809809 A | 5/2014 |
| CN | 104898892 | 9/2015 |
| CN | 105159486 | 12/2015 |
| KR | 20140062341 | 5/2014 |

OTHER PUBLICATIONS

International Search Report for PCT/CN2016/081995 dated Oct. 27, 2016.
First Office Action for Chinese Patent Application No. 201610151108.X dated Feb. 26, 2018.

* cited by examiner

ORGANIC LIGHT EMITTING DISPLAY PANEL AND FABRICATING METHOD THEREOF, DISPLAY DEVICE

RELATED APPLICATIONS

The present application is the U.S. national phase entry of PCT/CN2016/081995, with an international filing date of May 13, 2016, which claims the benefit of Chinese Patent Application No. 201610151108.X, filed on Mar. 16, 2016, the entire disclosures of which are incorporated herein by reference.

TECHNICAL FIELD

The present disclosure relates to the field of display technique, and particularly to an organic light emitting display panel, a fabricating method thereof, and a display device.

BACKGROUND

Active matrix organic light emitting diode (AMOLED) displays are more popular than liquid crystal display devices (LCD) due to the advantages of AMOLED technology like fast response, high brightness, low consumption, wide viewing angel, and the potential for a flexible display.

With the development of AMOLED technology and touch technology, organic light emitting display panels have been increasingly and widely used. Currently, on-cell touch technology is applied in organic light emitting display panels. In on-cell organic light emitting display panels, a touch structure is formed external to the organic light emitting display panel, complicating the process and increasing production costs. Since the touch structure is formed external to the organic light emitting display panel, the finished organic light emitting display panel has a large thickness as a whole.

In a flexible display, the thickness of the panel is critical and determines whether the panel is easy to bend. Existing on-cell touch organic light emitting display panels have large thicknesses and are difficult to bend.

SUMMARY

Embodiments of the present disclosure provide an organic light emitting display panel, a fabricating method thereof, and a display device, which decrease a thickness of the organic light emitting display panel.

In an exemplary embodiment, an organic light emitting display panel comprises a base substrate, a TFT array which is arranged on the base substrate, and a touch structure which is arranged between the base substrate and the TFT array.

In the organic light emitting display panel of the present embodiment, the touch structure is arranged between the base substrate and the TFT array. As compared with an existing organic light emitting display panel of the on-cell structure, the organic light emitting display panel in the embodiment of the present disclosure is more thin. The organic light emitting display panel with a decreased thickness is easier to bend, so that it can be applied not only to a rigid organic light emitting display, but also to a flexible organic light emitting display.

In an exemplary embodiment, the touch structure comprises touch driving electrodes and touch sensing electrodes which intersect with one another, and bridging lines. The touch driving electrodes are arranged in a same layer as and insulated from the touch sensing electrodes. At least one of the touch driving electrodes and the touch sensing electrodes are disconnected at intersection positions. The touch driving electrodes or the touch sensing electrodes which are disconnected at the intersection positions are electrically connected through respective bridging lines.

In an exemplary embodiment, the touch driving electrodes and the touch sensing electrodes are arranged on the base substrate.

In an exemplary embodiment, the bridging lines comprise first bridging lines, which are configured to electrically connect the disconnected touch driving electrode, and which are arranged in a same layer as and insulated from a first electrically conducting layer in the TFT array.

In the present embodiment, the first bridging lines are arranged in a same layer as and insulated from a first electrically conducting layer in the TFT array. In this way, the first bridging lines are formed at a same time as the first electrically conducting layer in the TFT array, thus simplifying process and saving production cost.

In an exemplary embodiment, the first electrically conducting layer is a source electrode layer or a gate electrode layer.

In an exemplary embodiment, the bridging lines comprise second bridging lines, which are configured to electrically connect the disconnected touch sensing electrode, and which are arranged in a same layer as and insulated from a second electrically conducting layer in the TFT array.

In the present embodiment, the second bridging lines are arranged in a same layer as and insulated from the second electrically conducting layer in the TFT array. In this way, the second bridging lines are formed at a same time as the second electrically conducting layer in the TFT array, thus simplifying process and saving production cost.

In an exemplary embodiment, the second electrically conducting layer is a source electrode layer or a gate electrode layer.

In an exemplary embodiment, the bridging lines comprise first bridging lines, which are configured to electrically connect the disconnected touch driving electrode; and second bridging lines, which are configured to electrically connect the disconnected touch sensing electrode. The first bridging lines are arranged in a same layer as and insulated from a first electrically conducting layer in the TFT array, the second bridging lines are arranged in a same layer as and insulated from a second electrically conducting layer in the TFT array, and the first electrically conducting layer and the second electrically conducting layer are different electrically conducting layers in the TFT array.

In the present embodiment, the first bridging lines are arranged in a same layer as and insulated from the first electrically conducting layer in the TFT array, and the second bridging lines are arranged in a same layer as and insulated from in the TFT array second electrically conducting layer. Thus, the first bridging lines are formed at a same time as the first electrically conducting layer in the TFT array, and the second bridging lines are formed at a same time as the second electrically conducting layer, thus simplifying process and saving production cost.

In an exemplary embodiment, the first electrically conducting layer is one of a gate electrode layer and a source electrode layer, and the second electrically conducting layer is the other one of the gate electrode layer and the source electrode layer.

For example, the first electrically conducting layer is a gate electrode layer, and the second electrically conducting layer is a source electrode layer. Alternatively, the second electrically conducting layer is a gate electrode layer, and the first electrically conducting layer is a source electrode layer.

In an exemplary embodiment, the base substrate is a glass substrate or a flexible substrate.

In an exemplary embodiment, the touch driving electrodes and the touch sensing electrodes comprise indium tin oxide or indium zinc oxide.

In an exemplary embodiment, the organic light emitting display panel comprises an insulating layer, which is arranged on the touch driving electrodes and the touch sensing electrodes and covers the touch driving electrodes and the touch sensing electrodes, wherein the first bridging lines electrically connect the disconnected touch driving electrode through a first via hole which penetrates the insulating layer.

In an exemplary embodiment, the organic light emitting display panel comprises an insulating layer, which is arranged on the touch driving electrodes and the touch sensing electrodes and covers the touch driving electrodes and the touch sensing electrodes, wherein the second bridging lines electrically connect the disconnected touch sensing electrode through a second via hole which penetrates the insulating layer.

In an exemplary embodiment, the insulating layer comprises silicon oxide, silicon nitride, or silicon oxynitride.

In an exemplary embodiment, the bridging lines are arranged in a non-light emitting region of the organic light emitting display panel.

An embodiment of the present disclosure further provides a display device, which comprises the organic light emitting display panel as described above.

An embodiment of the present disclosure further provides a method for fabricating an organic light emitting display panel, comprise steps of: forming touch driving electrodes and touch sensing electrodes which intersect with one another on a base substrate through a first patterning process, wherein the touch driving electrodes are disconnected at intersection positions; forming an insulating layer with a via hole on the base substrate resulting from the previous step through a second patterning process, wherein the via hole penetrates the insulating layer to expose a portion of the touch driving electrode; and forming a TFT array, bridging lines, and an organic light emitting device in this order on the base substrate resulting from the previous step, wherein the bridging lines electrically connect neighboring touch driving electrodes at intersection positions through the via hole.

In an exemplary embodiment, the bridging lines are formed in a same layer as a gate electrode and a source electrode in the TFT array.

DETAILED DESCRIPTION OF EMBODIMENTS

Embodiments of the present disclosure provide an organic light emitting display panel, a fabricating method thereof, and a display device, which decreases a thickness of the organic light emitting display panel.

The specific embodiments of the present disclosure shall be further described in the following text with reference to the figures and the embodiments. The following embodiments are only used for explaining more clearly the technical solution of the present disclosure rather than limiting the protection scope of the present disclosure.

The thickness of layers, as well as the size and shape of regions is not drawn to scale in drawings, which only intends to illustrate the concept of the present disclosure.

Figure 1A:
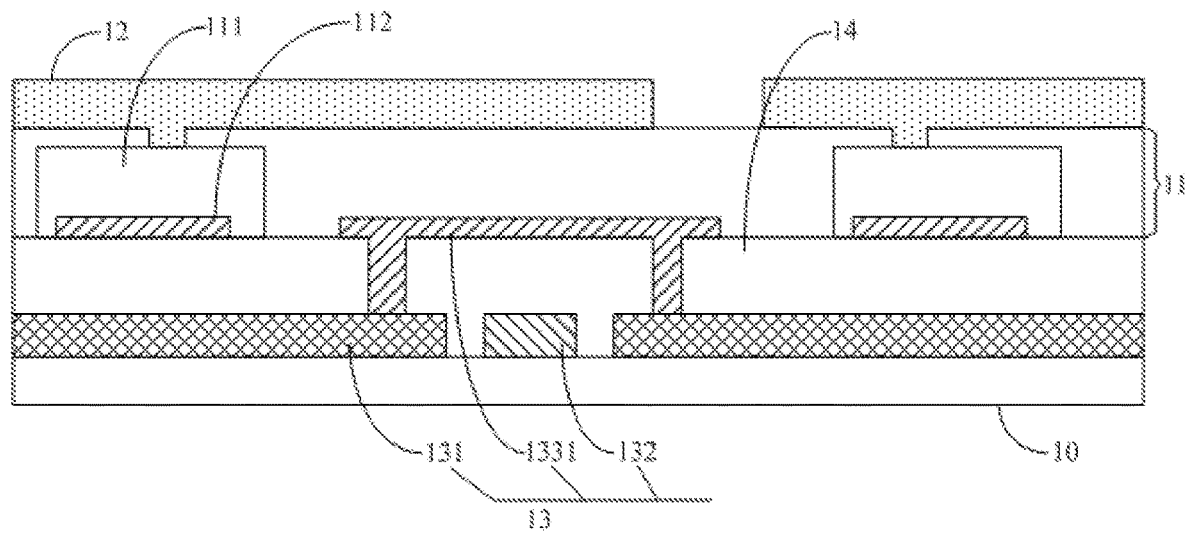
FIG. 1a is a cross-sectional view for illustrating an organic light emitting display panel in an embodiment of the present disclosure.
Figure 2A:
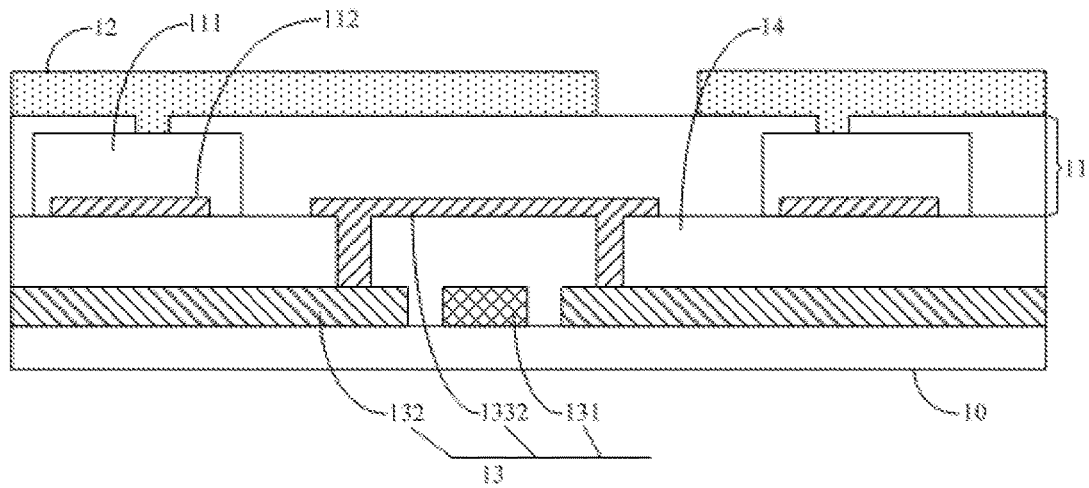
FIG. 2a is a cross-sectional view for illustrating an organic light emitting display panel in an embodiment of the present disclosure.

In an embodiment, as shown in FIG. 1a and FIG. 2a, an organic light emitting display panel comprises a base substrate 10, a TFT array 11 which is arranged on the base substrate 10, and a touch structure 13 which is arranged between the base substrate 10 and the TFT array 11. The touch structure 13 comprises touch driving electrodes 131 and touch sensing electrodes 132 which intersect with one another, and comprises bridging lines. The touch driving electrodes 131 and the touch sensing electrodes 132 are arranged in a same layer as and insulated from on the base substrate 10. The bridging lines comprise first bridging lines 1331 and/or second bridging lines 1332.

In an embodiment, the touch driving electrodes 131 are disconnected at intersection positions (where touch driving electrodes and touch sensing electrodes intersect with one another), and the first bridging lines 1331 electrically connect the disconnected touch driving electrodes, as shown in FIG. 1a.

In another embodiment, the touch sensing electrodes 132 are disconnected at intersection positions, and the second bridging lines 1332 electrically connect the disconnected touch sensing electrodes, as shown in FIG. 2a.

Figure 3:
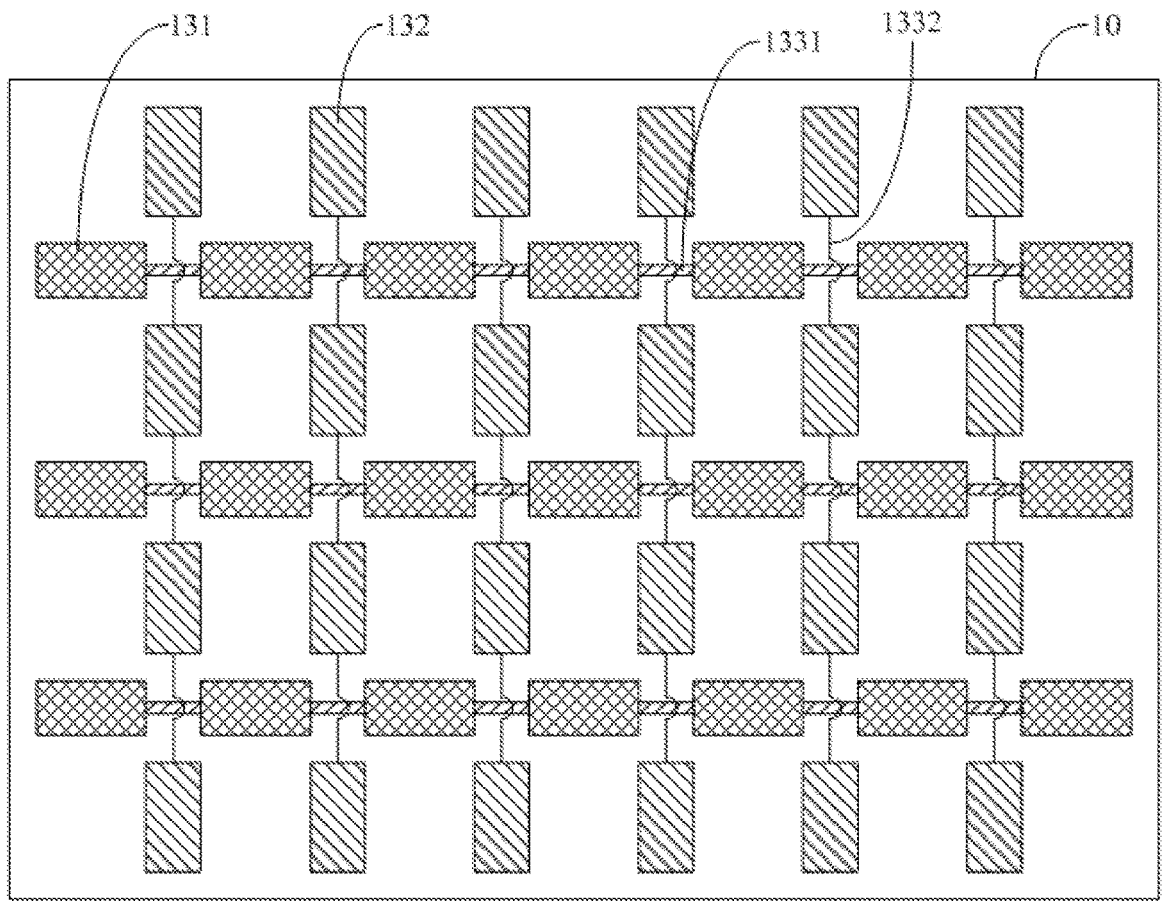
FIG. 3 is a plan view for illustrating an organic light emitting display panel in an embodiment of the present disclosure.

In a further embodiment, both the touch driving electrodes 131 and the touch sensing electrodes 132 are disconnected at intersection positions, as shown in FIG. 3. The first bridging lines 1331 electrically connect the disconnected touch driving electrodes, and the second bridging lines 1332 electrically connect the disconnected touch sensing electrodes.

In specific embodiments of the present disclosure, the TFT array on the base substrate has a same structure as the existing technology, which is not repeated here for simplicity. In specific embodiments of the present disclosure, the touch structure is integrated inside the organic light emitting display panel. As compared with the existing technology, the organic light emitting display panel is more thin. Since the organic light emitting display panel with a decreased thickness, it is easier to bend, so that it can be applied not only to a rigid organic light emitting display, but also to a flexible organic light emitting display.

For example, the first bridging lines 1331 are arranged in a same layer as and insulated from a first electrically conducting layer in the TFT array 11, and the second bridging lines 1332 are arranged in a same layer as and insulated from a second electrically conducting layer in the TFT array 11. The first electrically conducting layer and the second electrically conducting layer are different electrically conducting layers in the TFT array 11.

In an embodiment of the present disclosure, the first bridging lines or the second bridging lines are arranged in a same layer as and insulated from a respective electrically conducting layer in the TFT array. In this way, the first bridging lines or second bridging lines are formed at a same time as the electrically conducting layer in the TFT array, thus simplifying process and saving production cost.

Organic light emitting display panels in specific embodiments of the present disclosure will be described hereinafter with reference to drawings.

Figure 1B:
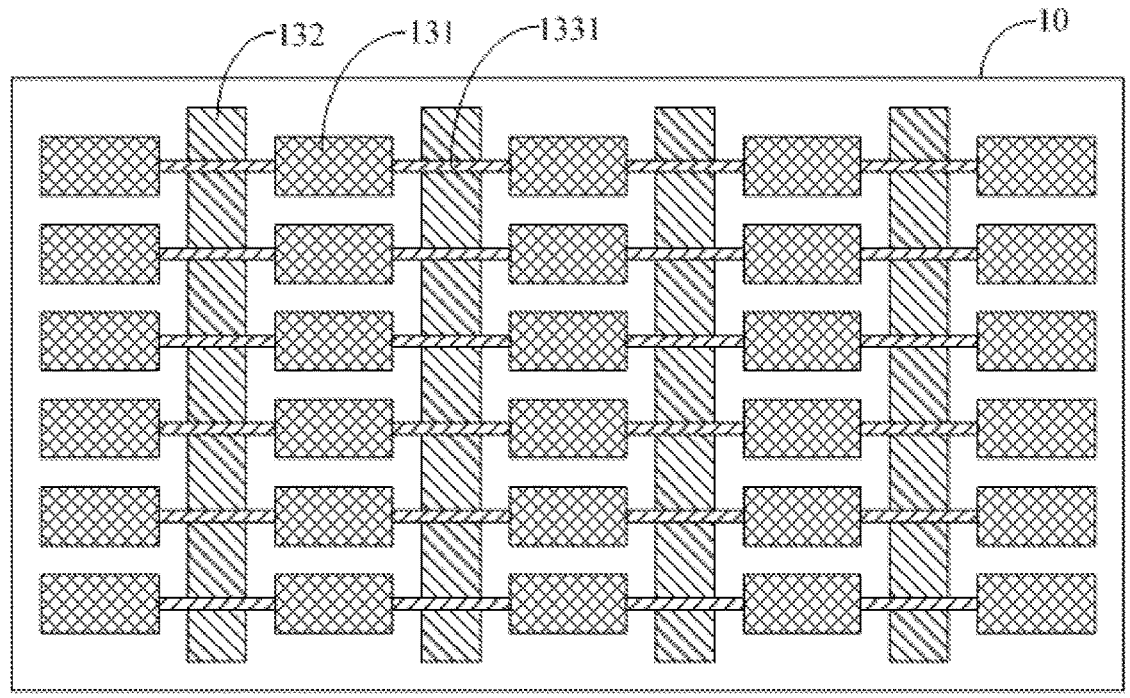
FIG. 1b is a plan view for illustrating an organic light emitting display panel in an embodiment of the present disclosure.

As shown in FIG. 1*a* and FIG. 1*b*, an embodiment of the present disclosure provides an organic light emitting display panel, which comprises the base substrate 10, the TFT array 11 which is arranged on the base substrate 10, an organic light emitting device 12, and the touch structure 13 which is arranged between the base substrate 10 and the TFT array 11.

The touch structure 13 comprises the touch driving electrodes 131 and the touch sensing electrodes 132 which intersect with one another, and comprises the first bridging lines 1331. The touch driving electrodes 131 and the touch sensing electrodes 132 are arranged in a same layer as and insulated from on the base substrate 10. At intersection positions, the touch driving electrodes 131 are disconnected. The first bridging lines 1331 electrically connect the disconnected touch driving electrodes 131. The first bridging lines 1331 are arranged in a same layer as and insulated from any one of the electrically conducting layers in the TFT array 11.

In particular, according to a specific embodiment of the present disclosure, the touch driving electrodes comprise indium tin oxide (ITO) or indium zinc oxide (IZO). The touch sensing electrodes comprise ITO or IZO. For example, in a specific embodiment of the present disclosure, the touch driving electrodes comprise a same material as the touch sensing electrodes.

In specific embodiments of the present disclosure, the TFT array and the organic light emitting device which are arranged on the base substrate have a structure as the existing technology. In particular, as shown in FIG. 1*a*, the TFT array 11 comprises a plurality of TFTs 111 which are arranged in an array. Each of the TFTs 111 comprises a gate electrode 112. The organic light emitting device 12 is connected with the TFTs 111.

For example, in specific embodiments of the present disclosure, the first bridging lines 1331 are arranged in a same layer as the gate electrode 112 of TFTs 111. During practical fabricating process, the first bridging lines 1331 formed in specific embodiments of the present disclosure have a relatively small pattern dimension, e.g., about 10 μm*200 μm. The first bridging lines 1331 with such a dimension have no effect on the layout of gate electrodes in TFTs and gate lines which are arranged in a same layer as gate electrodes.

During practical fabricating process, for example, the first bridging lines are formed in non-light emitting region of the organic light emitting display panel. In this way, there is no effect on the display resolution, the display effect, and the light extraction efficiency. Even if the first bridging lines are formed in a light emitting region of the organic light emitting display panel, due to the relatively small pattern dimension of the first bridging lines, the first bridging lines will not have an evident effect on the display resolution, the display effect, and the light extraction efficiency.

In an alternative embodiment, the first bridging lines 1331 are arranged in a same layer as the source electrodes (or drain electrodes) in TFTs. As compared with the gate electrodes as well as the gate lines which are arranged in a same layer as the gate electrodes, the source electrodes in TFTs as well as the data lines which are arranged in a same layer as the source electrodes have a relatively complicated layout space. In case the first bridging lines are arranged in a same layer as the source electrodes, there is relatively small space available in the TFT array. In this case, it is difficult to lay out the first bridging lines, and defects like short circuit between lines are prone to occur during practical fabricating process.

In implementations, as shown in FIG. 1*a*, according to specific embodiments of the present disclosure, the touch driving electrodes 131 and the touch sensing electrodes 132 are insulated by an insulating layer 14. The insulating layer 14 is arranged on the touch driving electrodes 131 and the touch sensing electrodes 132, and covers the touch driving electrodes 131 and the touch sensing electrodes 132. The first bridging lines 1331 electrically connect the disconnected touch driving electrodes 131 through a via hole which penetrates the insulating layer 14. The touch driving electrodes 131 are partially exposed at the via hole.

Besides, as compared with the case in which the first bridging lines 1331 are arranged in a same layer as the source electrodes in TFTs 111, in case the first bridging lines 1331 are arranged in a same layer as the gate electrode 112 in each of TFTs 111, the via hole penetrates insulating layers and other layers of a less number, so that the possibility of defects can be significantly decreased during fabricating process.

For example, in specific embodiments of the present disclosure, the insulating layer comprises silicon oxide ($SiO_2$), silicon nitride ($Si_xN_y$), or silicon oxynitride ($SiN_xO_y$). In a practical design, the insulating layer may comprise other insulating materials. Specific embodiments of the present disclosure do not intend to make restriction to the material of the insulating layer.

For example, in specific embodiments of the present disclosure, the base substrate is a glass substrate or a flexible substrate. In specific embodiments of the present disclosure, the touch structure is integrated inside the organic light emitting display panel. As compared with the existing technology, the organic light emitting display panel is more thin, and has a decreased thickness so that it is easier to bend. In case the base substrate is a glass substrate, the organic light emitting display panel can be applied to a rigid organic light emitting display. In case the base substrate is a flexible substrate, the organic light emitting display panel can further be applied to a flexible organic light emitting display.

Figure 2B:
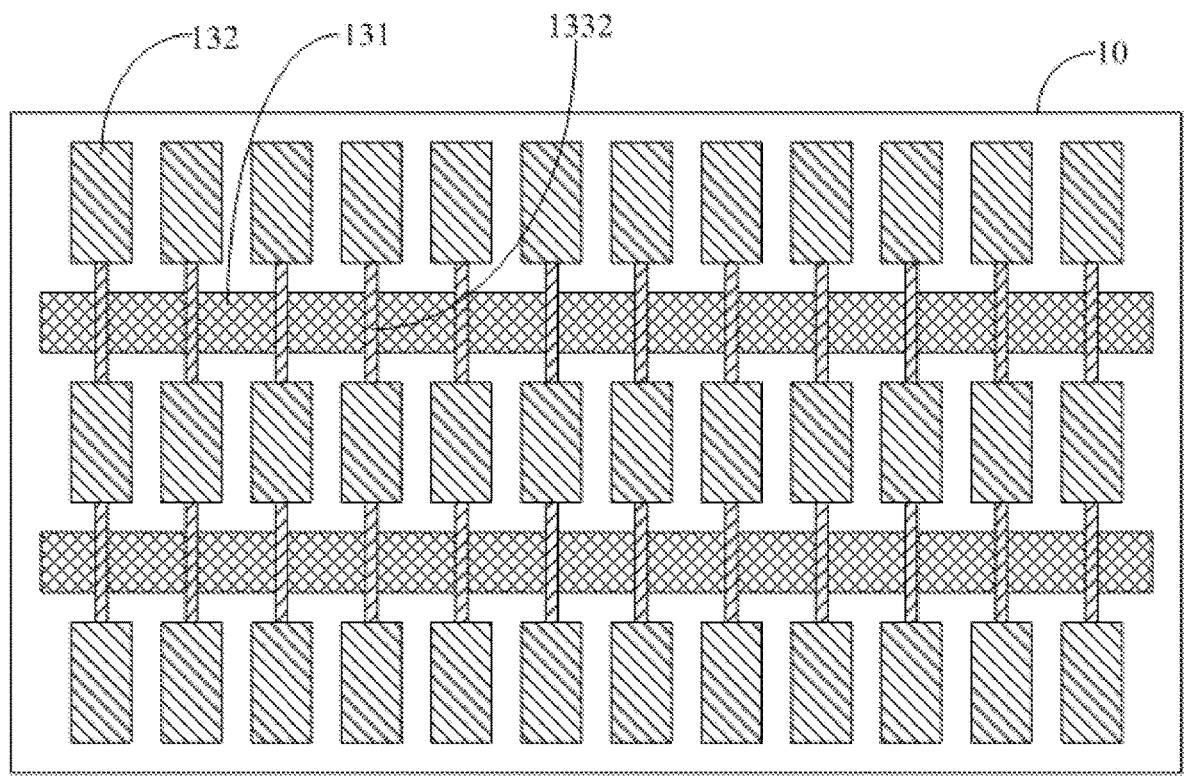
FIG. 2b is a plan view for illustrating an organic light emitting display panel in an embodiment of the present disclosure.

As shown in FIG. 2*a* and FIG. 2*b*, specific embodiments of the present disclosure provide an organic light emitting display panel, comprising the base substrate 10, the TFT array 11 which is arranged on the base substrate 10, the organic light emitting device 12, and the touch structure 13 which is arranged between the base substrate 10 and the TFT array 11.

The touch structure 13 comprises the touch driving electrodes 131 and the touch sensing electrodes 132 which intersect with one another, and comprises the second bridging lines 1332. The touch driving electrodes 131 and the touch sensing electrodes 132 are arranged in a same layer as and insulated from on the base substrate 10. At intersection positions, the touch sensing electrodes 132 are disconnected. The second bridging lines 1332 electrically connect the disconnected touch sensing electrodes 132. The second bridging lines 1332 are arranged in a same layer as and insulated from any one of the electrically conducting layers in the TFT array 11.

For example, in specific embodiments of the present disclosure, the base substrate is a glass substrate or a flexible substrate. In an alternative embodiment, the base substrate is a substrate like a ceramic substrate.

In specific embodiments of the present disclosure, the TFT array and the organic light emitting device which are arranged on the base substrate have a structure as the existing technology. In particular, as shown in FIG. 2a, the TFT array 11 comprises a plurality of TFTs 111 which are arranged in an array. Each of the TFTs 111 comprises the gate electrode 112. The organic light emitting device 12 is connected with each of the TFTs 111.

For example, in specific embodiments of the present disclosure, the second bridging lines 1332 are arranged in a same layer as the gate electrode 112 in each of the TFTs 111. During practical fabricating process, the second bridging lines formed in specific embodiments of the present disclosure have a relatively small pattern dimension, e.g., about 10 μm*200 μm. The second bridging lines with such a dimension have no effect on the layout of gate electrodes in TFTs and gate lines which are arranged in a same layer as gate electrodes.

In an alternative embodiment, the second bridging lines 1332 are arranged in a same layer as the source electrodes in TFTs. As compared with the gate electrodes as well as the gate lines which are arranged in a same layer as the gate electrodes, the source electrodes in TFTs as well as the data lines which are arranged in a same layer as the source electrodes have a relatively complicated layout space. In case the second bridging lines are arranged in a same layer as the source electrodes, there is relatively small space available in the TFT array. In this case, it is difficult to lay out the second bridging lines, and defects like short circuit between lines are prone to occur during practical fabricating process.

In implementations, as shown in FIG. 2a, according to specific embodiments of the present disclosure, the touch driving electrodes 131 and the touch sensing electrodes 132 are insulated by an insulating layer 14. The insulating layer 14 is arranged on the touch driving electrodes 131 and the touch sensing electrodes 132, and covers the touch driving electrodes 131 and the touch sensing electrodes 132. The second bridging lines 1332 electrically connect the disconnected touch sensing electrodes 132 through a via hole which penetrates the insulating layer 14. The touch sensing electrodes 132 are partially exposed at the via hole.

For example, in specific embodiments of the present disclosure, the insulating layer comprises $SiO_2$, SixNy, or SiNxOy. In an alternative embodiment, the insulating layer comprises other insulating materials. Specific embodiments of the present disclosure do not intend to make restriction to the material of the insulating layer.

As shown in FIG. 1a and FIG. 2a, in specific embodiments of the present disclosure, a front touch function can be realized in a bottom emitting OLED display device.

As shown in FIG. 3, specific embodiments of the present disclosure provide an organic light emitting display panel, comprising the base substrate 10, the TFT array 11 (not shown) which is arranged on the base substrate 10, the organic light emitting device (not shown), and the touch structure which is arranged between the base substrate 10 and the TFT array. In the present embodiment, the TFT array and the organic light emitting device have a same structure as the existing technology, and reference can be made to FIG. 1a and FIG. 2a.

The touch structure comprises the touch driving electrodes 131 and the touch sensing electrodes 132 which intersect with one another, and comprises bridging lines. The touch driving electrodes 131 and the touch sensing electrodes 132 are arranged in a same layer as and insulated from on the base substrate 10. At intersection positions, both the touch driving electrodes 131 and the touch sensing electrodes 132 are disconnected.

As shown in FIG. 3, the bridging lines comprise the first bridging lines 1331 and the second bridging lines 1332. The first bridging lines 1331 electrically connect the disconnected touch driving electrodes 131. The second bridging lines 1332 electrically connect the disconnected touch sensing electrodes 132.

The first bridging lines 1331 are arranged in a same layer as and insulated from any one of the electrically conducting layers in the TFT array. The second bridging lines 1332 are arranged in a same layer as and insulated from any one of the electrically conducting layers in the TFT array. The first bridging lines 1331 and the second bridging lines 1332 are arranged in different electrically conducting layers.

In an exemplary embodiment, the first bridging lines are arranged in a same layer as the gate electrode in the TFT array, and the second bridging lines are arranged in a same layer as the source electrode in the TFT array. In an alternative embodiment, the first bridging lines are arranged in a same layer as the source electrode in the TFT array, and the second bridging lines are arranged in a same layer as the gate electrode in the TFT array. In other alternative embodiments, the first bridging lines or the second bridging lines are arranged in a same layer as and insulated from other electrically conducting layers in the TFT array.

In particular, referring to FIG. 1a and FIG. 2a, in specific embodiments of the present disclosure, the touch driving electrodes 131 and the touch sensing electrodes 132 are insulated by the insulating layer 14. The insulating layer 14 is arranged on the touch driving electrodes 131 and the touch sensing electrodes 132, and covers the touch driving electrodes 131 and the touch sensing electrodes 132. The first bridging lines 1331 electrically connect the disconnected touch driving electrodes 131 through a first via hole which penetrates the insulating layer 14, and the second bridging lines 1332 electrically connect the disconnected touch sensing electrodes 132 through a second via hole which penetrates the insulating layer 14. The touch driving electrodes are partially exposed at the first via hole, and touch sensing electrodes are partially exposed at the second via hole. In the present embodiment, the first via hole and the second via hole do not intend the number of via holes. The first via hole indicates a group of via holes which partially expose the touch driving electrode, and this group of via holes comprise at least two via holes. The second via hole indicates a group of via holes which partially expose the touch sensing electrode, and this group of via holes also comprise at least two via holes.

Specific embodiments of the present disclosure further provide a display device, which comprises the organic light emitting display panel as described above. The display device for example is a display device like a liquid crystal touch panel, a liquid crystal display device, a liquid crystal TV, an organic light emitting diode (OLED) display, an OLED TV, or an electronic paper.

Figure 4:
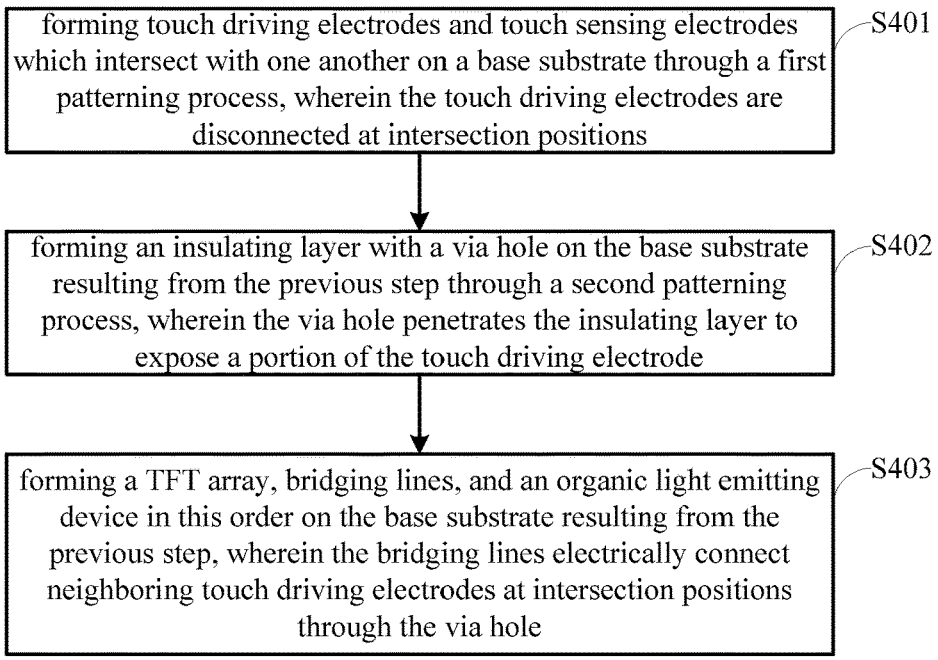
FIG. 4 is a flow chart for illustrating a method for fabricating an organic light emitting display panel in an embodiment of the present disclosure.

As shown in FIG. 4, a specific embodiment of the present disclosure further provides a method for fabricating an organic light emitting display panel. The method comprises steps S401, S402, and S403.

S401, forming touch driving electrodes and touch sensing electrodes which intersect with one another on a base substrate through patterning process, wherein the touch driving electrodes are disconnected and/or the touch sensing electrode disconnected at intersection positions.

S402, forming an insulating layer on the base substrate resulting from the previous step and a first via hole and/or second via hole which penetrate the insulating layer through a patterning process, wherein the touch driving electrodes are partially exposed at the first via hole, and the touch sensing electrodes are partially exposed at the second via hole.

S403, forming the TFT array, bridging lines, and organic light emitting devices on the base substrate resulting from the previous step through patterning processes, wherein the bridging lines comprise first bridging lines and/or second bridging line, the first bridging lines electrically connect the exposed and neighboring touch driving electrodes through the first via hole, the second bridging lines electrically connect the exposed and neighboring touch sensing electrodes through the second via hole.

Referring to the organic light emitting display panel shown in FIG. 1a and FIG. 1b, a method for fabricating the organic light emitting display panel comprises steps of: forming touch driving electrodes and touch sensing electrodes which intersect with one another on a base substrate through a first patterning process, wherein the touch driving electrodes are disconnected at intersection positions; forming an insulating layer with a via hole on the base substrate resulting from the previous step through a second patterning process, wherein the via hole penetrates the insulating layer to expose a portion of the touch driving electrode; and forming a TFT array, bridging lines, and an organic light emitting device in this order on the base substrate resulting from the previous step, wherein the bridging lines electrically connect neighboring touch driving electrodes at intersection positions through the via hole.

In particular, in a specific embodiment of the present disclosure, an electrically conducting layer is firstly deposited on a base substrate. For example, in a specific embodiment of the present disclosure, an layer of ITO is deposited on the base substrate, touch driving electrodes and touch sensing electrodes which intersect with one another are then formed through a patterning process, and at intersection positions, the touch driving electrodes are disconnected and/or the touch sensing electrodes are disconnected. The touch driving electrodes and the touch sensing electrodes as formed may have a structure shown in FIG. 1a, FIG. 1b, FIG. 2a, FIG. 2b, and FIG. 3. In a specific embodiment of the present disclosure, the patterning process comprises some or all of processes like photoresist coating, exposing, developing, etching, and photoresist removing.

Then, a layer of insulating material is deposited on the base substrate on which the touch driving electrodes and the touch sensing electrodes have been formed. An insulating layer and a first via hole and/or a second via hole which penetrate the insulating layer are formed through a patterning process. It is required for the touch driving electrodes to be partially exposed at the first via hole and the touch sensing electrodes to be partially exposed at the second via hole.

Then, a TFT array is formed on the insulating layer through patterning processes. In specific embodiments of the present disclosure, the TFT array is formed by a method similar with the existing technology, except that during forming the gate electrode of the TFT array, the first bridging lines or the second bridging lines are formed in a same patterning process. In case both the touch driving electrode and the touch sensing electrode are disconnected at intersection positions in specific embodiments of the present disclosure, during forming other electrode layers like the source electrode in the circuit, the other bridging lines are formed at a same time by a same patterning process. Since the bridging lines are formed at a same time as an electrically conducting layer in the TFT array in specific embodiments of the present disclosure, the process is simplified and the production cost is saved.

Then, organic light emitting devices are formed on the TFT array through a patterning process. In specific embodiments of the present disclosure, the organic light emitting devices are formed by a same method as the existing technology, which is not repeated here for simplicity.

In summary, specific embodiments of the present disclosure provide an organic light emitting display panel, comprising a base substrate, a TFT array which is arranged on the base substrate, and a touch structure which is arranged between the base substrate and the TFT array. Since the touch structure is arranged between the base substrate and the TFT array in specific embodiments of the present disclosure, as compared with the existing organic light emitting display panel of the on-cell structure, the organic light emitting display panel in specific embodiments of the present disclosure is more thin, which makes it easier to bend, so that it can be applied not only to a rigid organic light emitting display, but also to a flexible organic light emitting display.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An organic light emitting display panel, comprising a base substrate, a thin film transistor array which is arranged on the base substrate, and a touch structure which is arranged between the base substrate and the thin film transistor array,
   wherein the touch structure comprises touch driving electrodes and touch sensing electrodes which intersect with one another, and bridging lines, and at least one of the touch driving electrodes and the touch sensing electrodes is disconnected at intersection positions,
   wherein the touch driving electrodes and the touch sensing electrodes are arranged on the base substrate,
   wherein the bridging lines comprise first bridging lines, which are configured to electrically connect the disconnected touch driving electrodes, and which are arranged in a same layer as and insulated from a first electrically conducting layer in the thin film transistor array, and
   wherein the bridging lines comprise second bridging lines, which are configured to electrically connect the disconnected touch sensing electrodes, and which are arranged in a same layer as and insulated from a second electrically conducting layer in the thin film transistor array.

2. The organic light emitting display panel of claim 1, wherein the touch driving electrodes are arranged in a same layer as and insulated from the touch sensing electrodes, and the touch driving electrodes or the touch sensing electrodes which are disconnected at the intersection positions are electrically connected through respective bridging lines.

3. The organic light emitting display panel of claim 1, wherein the first electrically conducting layer is a source electrode layer or a gate electrode layer.

4. The organic light emitting display panel of claim 1, wherein the second electrically conducting layer is a source electrode layer or a gate electrode layer.

5. The organic light emitting display panel of claim 1, wherein the first electrically conducting layer and the second electrically conducting layer are different electrically conducting layers in the thin film transistor array.

6. The organic light emitting display panel of claim 5, wherein the first electrically conducting layer is one of a gate electrode layer and a source electrode layer, and the second electrically conducting layer is the other one of the gate electrode layer and the source electrode layer.

7. The organic light emitting display panel of claim 1, wherein the base substrate is a glass substrate or a flexible substrate.

8. The organic light emitting display panel of claim 2, wherein the touch driving electrodes and the touch sensing electrodes comprise indium tin oxide or indium zinc oxide.

9. The organic light emitting display panel of claim 1, further comprising an insulating layer, which is arranged on the touch driving electrodes and the touch sensing electrodes and covers the touch driving electrodes and the touch sensing electrodes, wherein the first bridging lines electrically connect the disconnected touch driving electrodes through a first via hole which penetrates the insulating layer.

10. The organic light emitting display panel of claim 1, further comprising an insulating layer, which is arranged on the touch driving electrodes and the touch sensing electrodes and covers the touch driving electrodes and the touch sensing electrodes, wherein the second bridging lines electrically connect the disconnected touch sensing electrodes through a second via hole which penetrates the insulating layer.

11. The organic light emitting display panel of claim 9, wherein the insulating layer comprises silicon oxide, silicon nitride, or silicon oxynitride.

12. The organic light emitting display panel of claim 2, wherein the bridging lines are arranged in a non-light emitting region of the organic light emitting display panel.

13. A display device, comprising an organic light emitting display panel, wherein the organic light emitting display panel comprises a base substrate, a thin film transistor array which is arranged on the base substrate, and a touch structure which is arranged between the base substrate and the thin film transistor array, wherein the touch structure comprises touch driving electrodes and touch sensing electrodes which intersect with one another, and bridging lines, and at least one of the touch driving electrodes and the touch sensing electrodes is disconnected at intersection positions, wherein the touch driving electrodes and the touch sensing electrodes are arranged on the base substrate, wherein the bridging lines comprise first bridging lines, which are configured to electrically connect the disconnected touch driving electrodes, and which are arranged in a same layer as and insulated from a first electrically conducting layer in the thin film transistor array, and wherein the bridging lines comprise second bridging lines, which are configured to electrically connect the disconnected touch sensing electrodes, and which are arranged in a same layer as and insulated from a second electrically conducting layer in the thin film transistor array.

14. A method for fabricating an organic light emitting display panel, comprising steps of:

forming touch driving electrodes and touch sensing electrodes which intersect with one another on a base substrate through a first patterning process, wherein the touch driving electrodes are disconnected at intersection positions, and the touch driving electrodes and the touch sensing electrodes are arranged on the base substrate;

forming an insulating layer with a via hole through a second patterning process, wherein the via hole penetrates the insulating layer to expose a portion of the touch driving electrode; and forming a thin film transistor array, bridging lines, and an organic light emitting device in this order, wherein the bridging lines electrically connect neighboring touch driving electrodes at intersection positions through the via hole, the bridging lines comprise first bridging lines, which are configured to electrically connect the disconnected touch driving electrodes, and which are arranged in a same layer as and insulated from a first electrically conducting layer in the thin film transistor array, and the bridging lines comprise second bridging lines, which are configured to electrically connect the disconnected touch sensing electrodes, and which are arranged in a same layer as and insulated from a second electrically conducting layer in the thin film transistor array.

15. The method of claim 14, wherein the first electrically conducting layer is one of a gate electrode layer and a source electrode layer, and the second electrically conducting layer is the other one of the gate electrode layer and the source electrode layer.

* * * * *